United States Patent
Steele et al.

(10) Patent No.: US 7,683,604 B1
(45) Date of Patent: Mar. 23, 2010

(54) AMPLIFIER TOPOLOGY AND METHOD FOR CONNECTING TO PRINTED CIRCUIT BOARD TRACES USED AS SHUNT RESISTORS

(75) Inventors: Gerald W. Steele, Tucson, AZ (US); Edward Mullins, Sahuarita, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/286,627

(22) Filed: Oct. 1, 2008

(51) Int. Cl.
*G01R 1/30* (2006.01)
(52) U.S. Cl. ............................................. 324/123 R
(58) Field of Classification Search .............. 324/765, 324/763, 158.1, 123 R; 257/48; 438/14–18; 323/282–283, 285, 299, 226; 327/77, 78
See application file for complete search history.

(56) References Cited

U.S. PATENT DOCUMENTS 6,208,124 B1 * 3/2001 Fuchigami et al. .......... 323/281
6,504,347 B1 * 1/2003 Smith et al. ................. 323/226

* cited by examiner

*Primary Examiner*—Ha Tran T Nguyen
*Assistant Examiner*—Tung X. Nguyen
(74) *Attorney, Agent, or Firm*—John J. Patti; Wade J. Brady, III; Frederick J. Telecky, Jr.

(57) ABSTRACT

An integrated circuit current shunt amplifier (2A) includes an amplifier (9) having a (+) input connected to a first terminal (5A) of a shunt resistor ($R_{SHUNT}$). An output transistor (24) has a gate coupled to an output of the amplifier, a source coupled to a (−) input of the amplifier, and a drain coupled to a first terminal of an output resistor ($R_{OUT}$). A gain resistor ($R_{GAIN}$) is coupled between the (−) input of the amplifier and a second terminal of the shunt resistor. The gain resistor has a temperature coefficient which is essentially the same as that of the shunt resistor. A voltage regulator (26) can be coupled between the second terminal of the shunt resistor and a low-side supply voltage terminal (27) of the amplifier. A charge pump (30) can provide a below-ground voltage on a second terminal of the output resistor. A difference amplifier (31) coupled to the drain and referenced to the below-ground voltage produces an output voltage (Vout) referenced to ground.

20 Claims, 4 Drawing Sheets

US 7,683,604 B1

AMPLIFIER TOPOLOGY AND METHOD FOR CONNECTING TO PRINTED CIRCUIT BOARD TRACES USED AS SHUNT RESISTORS

BACKGROUND OF THE INVENTION

The present invention relates generally to current sensing amplifiers, and more particularly to a current sensing amplifier which is capable of accurately sensing current flowing through a trace conductor on a printed circuit board (PCB) and providing instant, automatic temperature compensation of the sensed value by means of a gain resistor that is included within the current sensing amplifier and is composed of essentially the same kind of material as the trace conductor.

It would be desirable to have a highly accurate current sense amplifier that can be used when there is a need for precise measurement of current flowing in a PCB conductor. Furthermore, even if a particular application does not require accurate measurement of the amount of current flowing into a load to accomplish a primary function of the application, it nevertheless often is desirable to have an accurate, temperature-compensated value representing the voltage drop in a copper trace conductor of a PCB in order to detect an overload condition so that appropriate steps can be taken to avoid damage from being caused by the overload condition.

The closest known current sensing amplifier, shown in subsequently described Prior Art FIG. 1, requires complex circuitry and an associated method of temperature-compensating a voltage drop across the shunt resistor, by (1) sensing the voltage drop across the shunt resistor, (2) generating a signal representative of the shunt resistor temperature by means of a temperature sensor, and (3) externally digitizing and using that temperature signal to temperature-compensate an externally digitized representation of the sensed voltage drop across the shunt resistor by means of expensive and time-consuming digital techniques, for example by means of a microcontroller.

The closest prior art is believed to be shown in the published data sheet entitled "IA2410 High Voltage, High-Side Current Sense Amplifier" (date unknown), published by Integration Associates, Inc. of Mountain View, Calif. Prior Art FIG. 1 shows a functional block diagram of the current sense amplifier 2 in the above mentioned data sheet. Referring to Prior Art FIG. 1, the circuitry 1A includes the IA2410 current sense amplifier 2 connected to measure the voltage across a shunt resistor 6, which is illustrated as being on a printed circuit board 3. Printed circuit board 3 includes application circuitry 4 connected by a copper trace conductor 5 to one terminal of shunt resistor 6, which has a resistance $R_{SHUNT}$. The other terminal of shunt resistor 6 is connected by copper trace conductor 5A to load circuitry 8, which can be located on or off printed circuit board 3. The above mentioned data sheet reference suggests that shunt resistor 6 could possibly be a section of the copper trace conductor 5,5A.

Conductor 5 in Prior Art FIG. 1 is coupled by a first gain resistor $R_{G2}$ to the (+) input of an operational amplifier 9 in current sense amplifier 2, which also includes a variable current source 11, a temperature sensor 14, a switch 15, a buffer 16, and a control circuit 17. Conductor 5A is coupled by a second gain resistor $R_{G1}$ to the (−) input of operational amplifier 9, the output of which is coupled by conductor 10 to the control input of variable current source 11. The upper terminal of variable current source 11 is connected to the (+) input of operational amplifier 9, and the lower terminal of variable current source 11 is coupled by means of a switch 20 to an output conductor 12 on which an output voltage is produced.

Output conductor 12 is connected to one terminal of an output resistor 13 and also to the output of a buffer circuit 16. The input of buffer 16 is connected to one terminal of a switch 15, the other terminal of which is connected to the output of a temperature sensor 14.

The output of temperature sensor 14 and the output of the current source 11 representing the voltage across $R_{SHUNT}$ can be selectively applied to Vout conductor 12 by means of control circuit 17, switch 15, switch 20, and buffer circuit 16. The output of temperature sensor 14 thereby can be provided as an input to buffer circuit 16, the output of which can be digitized and used externally to temperature-compensate a digitized representation of the load current through $R_{SHUNT}$. Control circuit 17 can control when each of the lower terminal of current source 11 and the output of temperature sensor 14 are operatively coupled, one at a time, to Vout conductor 12.

The use of current sensing amplifiers to accurately sense the voltage drop across a portion of a copper trace on a printed circuit board over a normal operating temperature range of −40 to +125 degrees Centigrade is problematic because this involves difficult trade-offs. Copper is a high-conductivity metal conductor rather than a resistive material, so a section of a conventional printed copper trace conductor would need to be very long (and perhaps configured in a serpentine pattern) in order to have a sufficiently high resistance to be usable as a shunt resistor for a conventional current sense amplifier. Use of a portion of a typical PCB copper trace conductor as a shunt resistor generally has been considered to be impractical because it would require a large and costly amount of PCB area.

Thus, there is an unmet need for an integrated circuit current sensing amplifier which makes it practical to provide very low cost, very accurate sensing of current flowing through a printed circuit board conductor.

There also is an unmet need for an integrated circuit current sensing amplifier which makes it practical to provide very low cost, very accurate sensing of current flowing through a printed circuit board conductor without requiring use of a temperature-sensing element.

There also is an unmet need for an integrated circuit current sensing amplifier which makes it practical to provide very low cost, very accurate sensing of a voltage developed across a portion of a printed circuit board conductor used as an external shunt resistance in response to a load current flowing through the printed circuit board conductor, wherein the current sensing amplifier provides simple, instant temperature compensation of the sensed voltage.

There also is an unmet need for an integrated circuit current-sensing amplifier which avoids the external digitizing and computation which the prior art requires to temperature-compensate the measured voltage across a shunt resistor.

SUMMARY OF THE INVENTION

It is an object of the invention to provide a current sensing amplifier which makes it practical to provide very low cost, very accurate sensing of current flowing through a printed circuit board conductor.

It is another object of the invention to provide an integrated circuit current sensing amplifier which makes it practical to provide very low cost, very accurate sensing of current flowing through a printed circuit board conductor without requiring use of a temperature-sensing element.

It is another object of the invention to provide an integrated circuit current sensing amplifier which makes it practical to provide very low cost, very accurate sensing of a voltage developed across a portion of a printed circuit board conductor used as an external shunt resistance in response to a load current flowing through the printed circuit board conductor, wherein the current sensing amplifier provides simple, instant temperature compensation of the sensed voltage.

It is another object of the invention to provide an integrated circuit current-sensing amplifier which avoids the external digitizing and computation which the prior art requires to temperature-compensate the measured voltage across a shunt resistor.

Briefly described, and in accordance with one embodiment, the present invention provides an integrated circuit current shunt amplifier (2A) which includes an amplifier (9) having a (+) input connected to a first terminal (5A) of a shunt resistor ($R_{SHUNT}$). An output transistor (24) has a control electrode coupled to an output (10) of the amplifier, a first electrode coupled to the (−) input of the amplifier, and a second electrode coupled to a first terminal of an output resistor ($R_{OUT}$). A gain resistor ($R_{GAIN}$) is coupled between the (−) input of the amplifier (9) and a second terminal of the shunt resistor ($R_{SHUNT}$). The gain resistor ($R_{GAIN}$) has a temperature coefficient which is essentially the same as that of the shunt resistor. A shunt voltage regulator (26) can be coupled between the second terminal of the shunt resistor and a low-side supply voltage terminal (27) of the amplifier. A charge pump (30) can provide a below-ground voltage on a second terminal of the output resistor, in which case a difference amplifier (31) coupled to the second electrode and referenced to the below-ground voltage produces an output voltage (Vout) of the current shunt amplifier.

In one embodiment, the invention provides an integrated circuit current sensing amplifier (2A,B,C) for sensing a voltage drop across a shunt resistor ($R_{SHUNT}$) including a first amplifier (9) having first (−) and second (+) inputs and an output (10), the second (+) input being connected to a first terminal (5A) of the shunt resistor ($R_{SHUNT}$). An output transistor (24) has a control electrode coupled to the output (10) of the first amplifier (9), a first electrode (23) coupled to the first input (−) of the first amplifier (9), and a second electrode (12) coupled to a first terminal (12) of an output resistor ($R_{OUT}$). A gain resistor ($R_{GAIN}$) is coupled between the first (−) input of the first amplifier (9) and a second terminal (5) of the shunt resistor ($R_{SHUNT}$). The gain resistor ($R_{GAIN}$) has a temperature coefficient which is essentially the same as that of the shunt resistor ($R_{SHUNT}$).

In one embodiment, a voltage regulator circuit (26) is coupled between the second terminal (5) of the shunt resistor ($R_{SHUNT}$) and a low-side supply voltage terminal (27) of the first amplifier (9) for establishing a voltage on the low-voltage supply terminal (27). The shunt resistor ($R_{SHUNT}$) is a section of a printed circuit board trace conductor (5,6A,5B) and the gain resistor ($R_{GAIN}$) is composed of essentially the same kind of material as the shunt resistor ($R_{SHUNT}$). In the described embodiments, the shunt resistor ($R_{SHUNT}$) is composed of copper and is a thin film resistor. In one embodiment, the output resistor ($R_{OUT}$) is located outside of the current sensing amplifier (2B,C).

In one embodiment, the current sensing amplifier includes a charge pump (30) producing an output voltage ($V_{32}$) on a second terminal of the output resistor (13A) and a first input (−) of a second amplifier (31) having a second input (+) connected to the second electrode (12) of the output transistor (24), wherein the second amplifier (31) produces an output voltage (Vout) of the current sensing amplifier on an output conductor (33) of the current sensing amplifier. The output (27) of the voltage regulator (26) is coupled to a lower supply voltage terminal of the first amplifier (9) and to an output of a current mirror (Q1,2) receiving a bias current ($I_{BIAS}$) as an input. The output transistor ($R_{OUT}$) is composed of sichrome.

In one embodiment, the invention provides a method for sensing a voltage drop produced across a shunt resistor ($R_{SHUNT}$) by a load current ($I_{LOAD}$) flowing through the shunt resistor, including providing a gain resistor ($R_{GAIN}$) as part of an integrated circuit current sensing amplifier (2A,B,C), the gain resistor ($R_{GAIN}$) having a temperature coefficient essentially the same as a temperature coefficient of the shunt resistor ($R_{SHUNT}$), coupling a first terminal (5) of the shunt resistor ($R_{SHUNT}$) to a first terminal of the gain resistor ($R_{GAIN}$) and coupling a second terminal of the shunt resistor a first input (−) of a first amplifier (9) and coupling a second terminal (5A) of the shunt resistor ($R_{SHUNT}$) to a second input (+) of the first amplifier (9), and coupling an output (10) of the first amplifier (9) to a control electrode of an output transistor (24), coupling a first electrode (23) of the output transistor (24) to the first input (−) of the first amplifier (9), and coupling a second electrode (12) of the output transistor (24) to a first terminal (12) of an output resistor ($R_{OUT}$) to produce an output voltage ($V_{OUT}$) representative of the load current ($I_{LOAD}$).

In one embodiment, the method includes coupling voltage regulator circuitry (26) between the first terminal (5) and a low-side supply terminal (27) of the first amplifier (5). A reduced physical size of the shunt resistor (6A) is achieved by providing a value of resistance ($R_{GAIN}$) of the gain resistor (22) that is much greater than a value of resistance ($R_{SHUNT}$) of the shunt resistor (6A). A value of voltage ($V_5$) that is equal to or less than a ground voltage of the current sensing amplifier (2B,C) can be provided on the first terminal (5A) by coupling a first input (−) of an output amplifier (31) to an output (32) of a charge pump (30) which produces an output voltage ($V_{32}$) lower than the ground voltage of the current sensing amplifier (2B,C), coupling a second input (+) of the output amplifier (31) to the second electrode (12) of the output transistor (24), and coupling a second terminal of the output resistor ($R_{OUT}$) to the output (32) of the charge pump (30). The method includes forming the current sensing amplifier on an integrated circuit chip, and forming the shunt resistor as a section (6A) of copper conductor on a printed circuit board, and forming the gain resistor as a thin film copper resistor on the integrated circuit chip.

In one embodiment, the invention provides an integrated circuit current sensing amplifier (2A,B,C) for sensing a voltage drop produced across a shunt resistor ($R_{SHUNT}$) by a load current ($I_{LOAD}$) flowing through the shunt resistor, including gain resistor means ($R_{GAIN}$) in the integrated circuit current sensing amplifier (2A,B,C), the gain resistor means having a temperature coefficient essentially the same as a temperature coefficient of the shunt resistor ($R_{SHUNT}$), means (5) for coupling a first terminal of the shunt resistor ($R_{SHUNT}$) to a first terminal of the gain resistor ($R_{GAIN}$) and means (23) for coupling a second terminal of the gain resistor ($R_{GAIN}$) to a first input (−) of an amplifier (9) and means (5A) for coupling a second terminal of the shunt resistor ($R_{SHUNT}$) to a second input (+) of the amplifier (9), and means (10) for coupling an output of the amplifier (9) to a control electrode of an output transistor (24), means (23) for coupling a first electrode of the output transistor (24) to the first input (−) of the amplifier (9), and means (12) for coupling a second electrode of the output transistor (24) to an output resistor ($R_{OUT}$) to produce an output voltage ($V_{OUT}$) representative of the load current ($I_{LOAD}$).

DETAILED DESCRIPTION OF THE PREFERRED EMBODIMENTS

Figure 1:
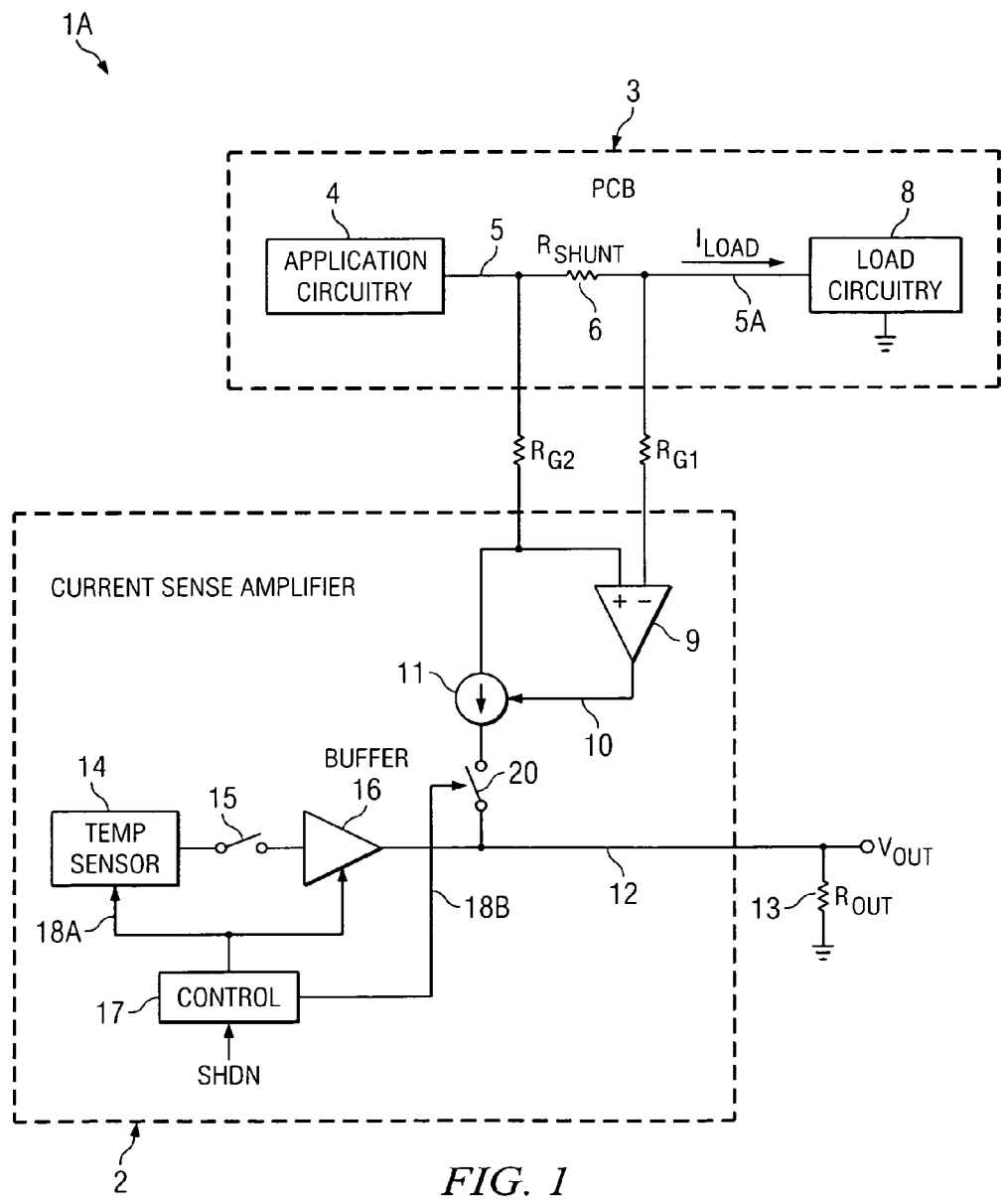
FIG. 1 is a functional block diagram of a prior art current sense amplifier.
Figure 2:
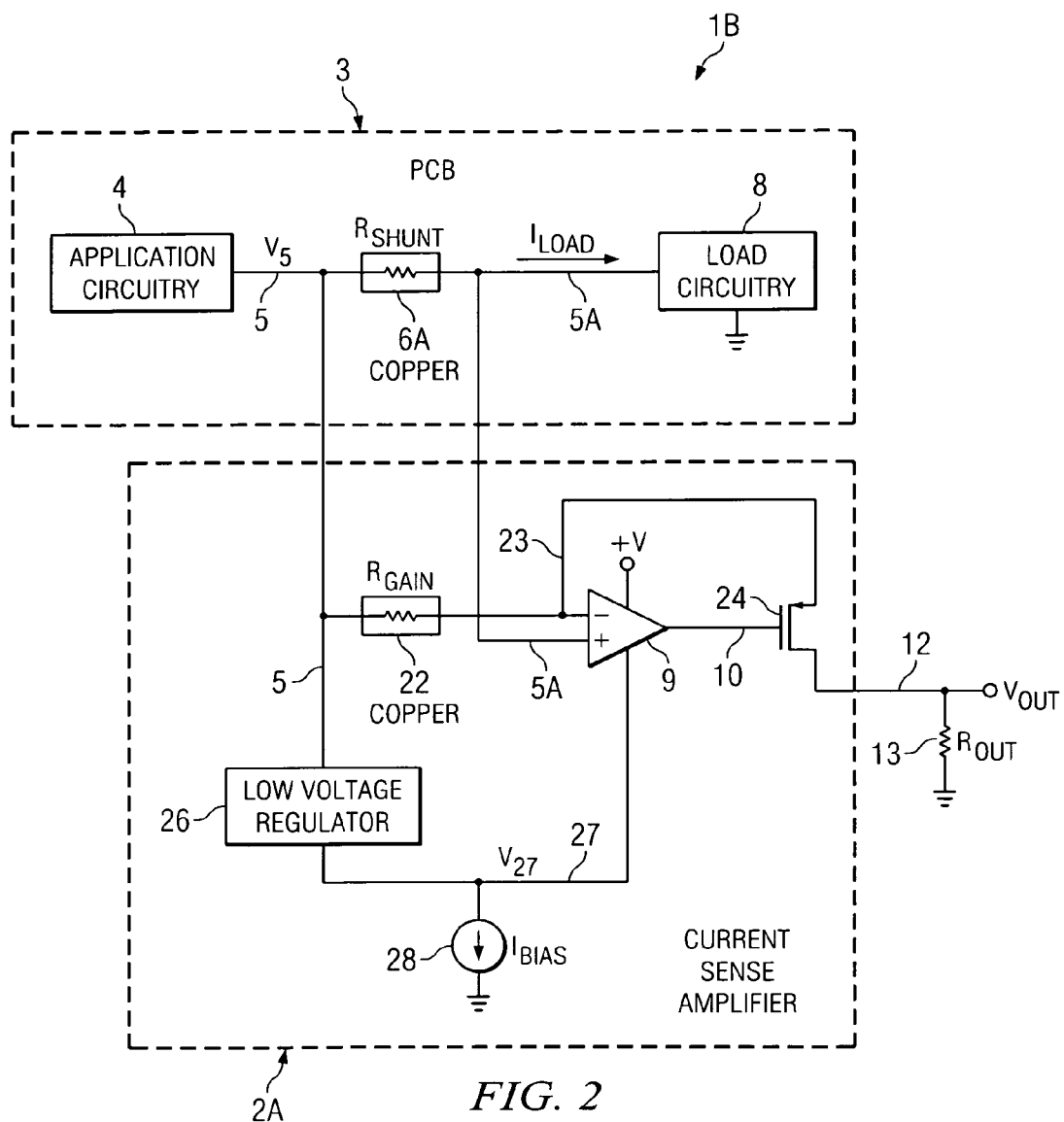
FIG. 2 is a schematic diagram of a basic implementation of a current sense amplifier according to the present invention.

Referring to FIG. 2, circuitry 1B includes a current sensing amplifier 2A connected to measure the voltage drop produced across shunt resistor 6A by load current $I_{LOAD}$. Printed circuit board 3 includes application circuitry 4 connected by copper trace conductor 5 to one terminal of shunt resistor 6A. Application circuitry 4 produces a voltage $V_5$ on copper trace conductor 5. The other terminal of shunt resistor 6A is connected by copper trace conductor 5A to load circuitry 8, which may be located on or off printed circuit board 3. Shunt resistor 6A, which has a resistance $R_{SHUNT}$, preferably is a section of a copper trace conductor 5,6A,5A which also includes copper trace conductors 5 and 5A on printed circuit board 3.

By way of definition, if shunt resistor $R_{SHUNT}$ is a section 6A of copper trace conductor 5,6A,5A, then the boundaries of the section 6A at which current-sensing amplifier 2A makes electrical contact to section 6A are referred to herein as "terminals" of shunt resistor $R_{SHUNT}$.

In accordance with the present invention, trace conductor 5 is coupled to one terminal of a copper gain resistor 22 of a resistance $R_{GAIN}$ which is included within integrated circuit current sense amplifier 2A. (Shunt resistor 6A and gain resistor 22 are sometimes referred to herein as "shunt resistor $R_{SHUNT}$" and "gain resistor $R_{GAIN}$", respectively.) The other terminal of copper gain resistor 22 is connected by conductor 23 to the (−) input of operational amplifier 9. The other terminal of copper shunt resistor 6A is connected by trace conductor 5A to the (+) input of operational amplifier 9. The output 10 of operational amplifier 9 is connected to the gate of a P-channel MOS output transistor 24, the source of which is connected by conductor 23 to the (−) input of operational amplifier 9. The drain of transistor 24 is connected by conductor 12 to an external resistor 13 having a resistance $R_{OUT}$. An output voltage $V_{OUT}$ representative of the value of $I_{LOAD}$ is produced on conductor 12. The other terminal of $R_{OUT}$ is connected to ground (or other suitable reference voltage).

Copper trace conductor 5 also may be connected to the input of a low-voltage shunt regulator 26, the output voltage $V_{27}$ of which is connected by conductor 27 to bias a low-side power terminal of operational amplifier 9. Regulator output conductor 27 also is connected to one terminal of a current source 28 which generates a current $I_{BIAS}$ that provides a suitable bias current for low voltage regulator 26 and operational amplifier 9.

The voltage produced between conductors 5 and 27 by low voltage regulator 26 is applied from each of the inputs to the lower-side supply voltage terminals of amplifier 9, and may need to be less than 5 volts, whereas the voltage on conductor 5 might be 20 volts. However, it should be appreciated that voltage regulator 26 is not essential to all embodiments of the invention. Various implementations of low voltage regulator 26, bias current source 28, and operational amplifier 9 are conventional and can be readily implemented by those skilled in the art.

Copper gain resistor 22 in integrated circuit current-sensing amplifier 2A can have a resistance $R_{GAIN}$ of, for example, 1 ohm, which is much greater than the resistance $R_{SHUNT}$ of the portion 6A of copper trace conductor 5,5A which is used as the shunt resistor 6A. Shunt resistance $R_{SHUNT}$ does not need to have any particular absolute relationship to the resistance $R_{GAIN}$ of gain resistor 22, but the two resistances must have substantially the same temperature dependence. Copper resistor 22 can be formed as a thin film top layer on the integrated circuit chip by means of an additional metallization step. Several companies in the integrated circuit industry, including the present assignee, provide copper metallization traces in this manner. The resistance $R_{GAIN}$ of the gain resistor 22 can be much greater than the resistance of a section of a typical copper metal trace on a printed circuit board. Preferably, plating or tinning of the portion 6A of the copper printed circuit board conductor which is used as $R_{SHUNT}$ should be avoided or minimized because such plating or tinning can influence the temperature coefficient of $R_{SHUNT}$.

Preferably, operational amplifier 9 is a "zero-drift" auto-zero and/or chopper-stabilized amplifier, in order to essentially eliminate any offset voltage of operational amplifier 9. This is important because copper is so conductive that the voltage drop across the shunt resistor is extremely low. The only practical way of measuring such a low voltage drop, which may be as low as roughly 50 microvolts, is by using an amplifier having essentially zero input offset voltage. Elimination of the input offset voltage enables operational amplifier 9 to accurately amplify such a small input voltage (e.g., 50 microvolts) developed across $R_{SHUNT}$. This can be best accomplished with a typical "low drift" amplifier, such as one that is chopper stabilized, auto-zeroed, or both. That in turn allows a substantially smaller required length of copper trace conductor in order to provide a sufficiently large amount of shunt resistance $R_{SHUNT}$ that the load current $I_{LOAD}$ can generate a voltage drop that is large enough to be accurately amplified by operational amplifier 9. Chopper-stabilized and/or auto-zero operational amplifiers are well known and widely used in the art. See "Demystifying Auto-Zero Amplifiers—Part 1" by Eric Nolan, Analog Dialogue 34-2 (2000).

Current sensing amplifier 2A measures the voltage drop across shunt resistor $R_{SHUNT}$ and automatically, instantly temperature-compensates that voltage drop so as to generate an output voltage on conductor 12 that is essentially independent of the temperature of shunt resistor $R_{SHUNT}$. The output voltage on conductor 12 therefore very precisely indicates the value of the current $I_{LOAD}$ flowing through shunt resistance $R_{SHUNT}$.

As previously mentioned, it should be understood that low voltage regulator 26 is not essential to the basic idea of the present invention. However, it is a component of the described high side current sensing amplifiers in FIGS. 2-4 which can measure the load current $I_{LOAD}$ flowing through conductor 5,5A and $R_{SHUNT}$, the voltage of which is above ground. It should also be understood that a shunt resistor can be placed in a ground voltage conductor, and a simple operational amplifier configuration can be used to sense the current flowing in the ground voltage conductor, a section of which serves as the shunt resistor.

Figure 3:
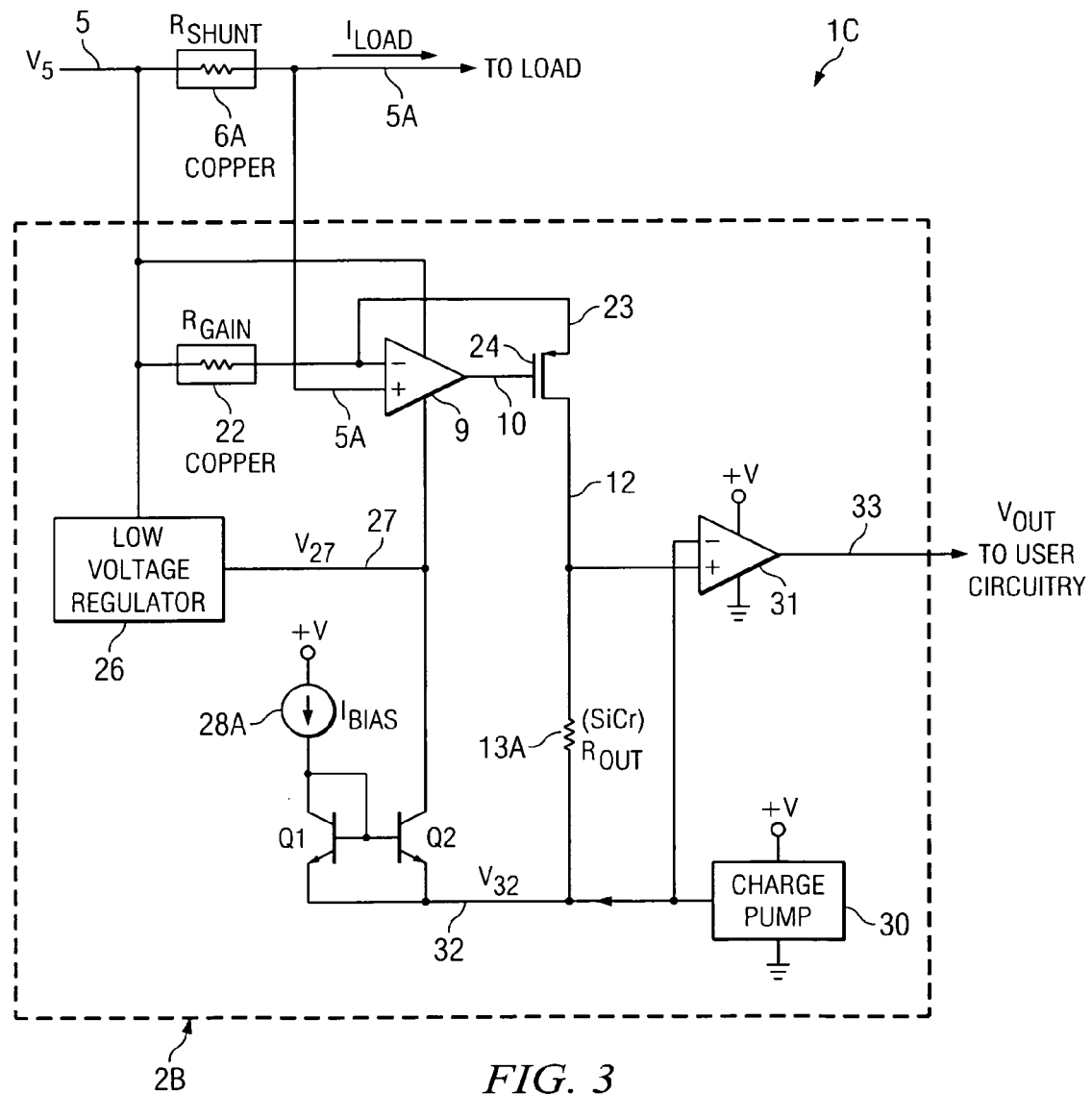
FIG. 3 is a schematic diagram of another implementation of a current sense amplifier of the present invention.

Referring to FIG. 3, integrated circuit current sense amplifier 2B includes copper gain resistor 22, operational amplifier 9, low-voltage regulator 26, and transistor 24 connected essentially as shown in FIG. 2. $R_{OUT}$ is provided within current-sensing amplifier 2B, and is implemented by means of a sichrome (SiCr) resistor 13A coupled between conductor 12 and the output 32 of a conventional charge pump 30. Sichrome resistor 13A can readily be provided with a very low temperature coefficient. The upper-side supply voltage terminal of operational amplifier 9 is connected to copper trace conductor 5. The +V and ground supply voltage terminals are connected to the upper-side and lower-side supply voltage terminals, respectively, of output amplifier 31.

Charge pump 30 is coupled between a positive supply voltage +V and ground and produces a voltage $V_{32}$ on conductor 32 that is below ground, e.g., at −2 volts. A bias current source 28A producing a bias current $I_{BIAS}$ is connected to the collector and base of current mirror input transistor Q1. Conductor 12 is connected to the (+) input of an output amplifier 31, the (−) input of which is connected to charge pump output conductor 32. The output $V_{OUT}$ of amplifier 31 is connected by conductor 33 to appropriate load circuitry (not shown). The voltage across $R_{OUT}$ appears between the (+) and (−) inputs of output amplifier 31.

Note that in current-sensing amplifier 2A of FIG. 2, the voltage of copper trace conductor 5 must be at a voltage greater than the output voltage on conductor 27 of low voltage regulator 26 (which may be, for example, from about 2 volts to about 5 volts) in order for the circuitry to function properly. It should be appreciated that the common mode voltage $V_5$ on conductor 5 can vary greatly, and the value of $I_{LOAD}$ also can vary greatly. A user may need to have the voltage of the copper trace conductor 5 at a substantially lower level than 2250 V, for example at ground voltage or below ground voltage. If, for example, the voltage $V_{27}$ on regulator output conductor 27 is 2 volts, and charge pump 30 generates a negative voltage of −2 volts, the voltage of copper trace conductor 5 could be as low as zero volts, but the −2 volt output 32 of charge pump nevertheless will allow a sufficient voltage drop across the sichrome resistor 13A, which may have a resistance of 250 ohms, to enable output amplifier 31 to sense the voltage across sichrome resistor 13A and produce a corresponding value of output voltage $V_{OUT}$ which is referenced to ground.

For example, suppose the voltage $V_5$ of conductor 5 falls from +20 volts to +5 volts, and shunt regulator 26 is a 5 volt regulator. In this case, bias current source 28 in previously described FIG. 2 can no longer provide bias current to regulator 26 and amplifier 9. In FIG. 3, the charge pump 30 establishes a value of voltage $V_{32}$ on conductor 32 which is below ground, e.g., −2 volts, and this enables the bias current circuit including transistors Q1 and Q2 and current source 28A to continue to provide bias current to enable regulator 26 and amplifier 9 to function properly.

Figure 4:
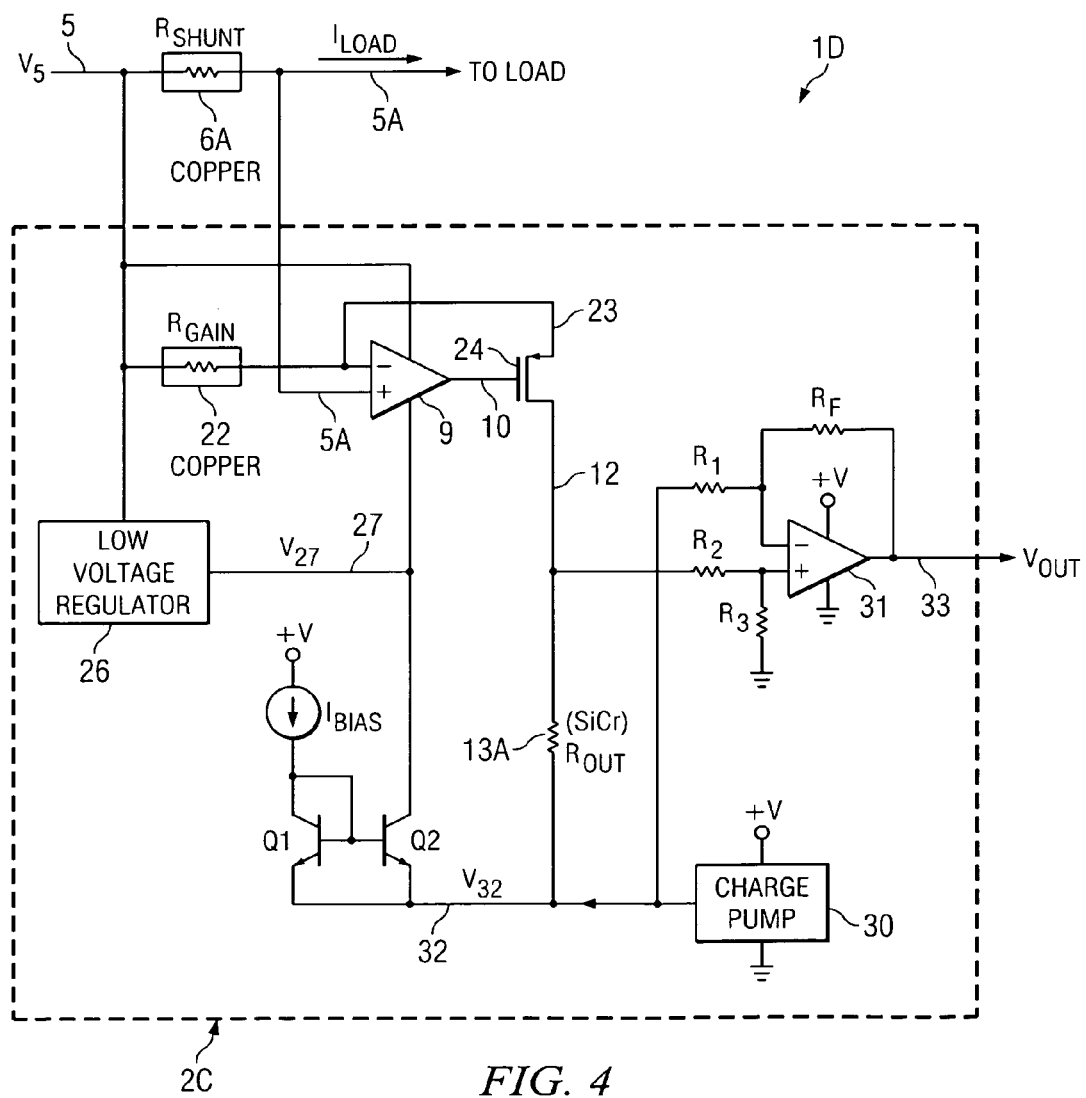
FIG. 4 is a schematic diagram of another implementation of a current sense amplifier of the present invention.

The voltage $V_{32}$ on conductor 32 in FIG. 3 may not be at a convenient level to be used as a reference voltage on the (−) input of output amplifier 31, since usually it is preferable that Vout is referenced to ground. Providing output amplifier 31 as a difference amplifier as shown in FIG. 4, with resistor R3 coupled between ground and the (+) input of output amplifier 31 provides a level-shifting function. (As a practical matter, voltage regulator 26 might receive a common mode input voltage $V_5$ in the range from 1.8 to 200 volts and produce an output voltage $V_{27}$ in the range from 0.9 to 20 volts.)

Current shunt amplifier 2C of FIG. 4 is the same as current shunt amplifier 2B of FIG. 3 except that the (+) input of output amplifier 31 in FIG. 4 is coupled by a resistor R2 to conductor 12 and by resistor R3 to ground, and the (−) input is coupled by resistor R1 to charge pump output conductor 32 and by feedback resistor $R_F$ to output conductor 33. A base or quiescent level of $V_{OUT}$ on conductor 33 can be set by setting $V_{27}$ the value of reference voltage connected to the lower terminal of resistor R3, which is ground in FIG. 4.

To summarize, the use of a copper resistor as a gain resistor in the described current-sensing amplifiers of the present invention amplifier provides automatic and immediate compensation of the temperature variation of the section of copper PCB trace conductor utilized as a shunt resistor. Furthermore, the use of an auto-zero amplifier or chopper-stabilized amplifier to sense the voltage drop across the shunt resistor further provides such temperature compensation even for very minute voltage drops across the shunt resistor. This is in contrast to the prior art, which requires a temperature sensor and complex analog and/or digital circuitry and additional operating time in order to facilitate use of a section of copper trace conductor as a shunt resistor. Furthermore, the current shunt amplifiers of FIGS. 3 and 4 are capable of sensing a load current $I_{LOAD}$ through either a high side (i.e., at a voltage above ground) shunt resistor or a low side (i.e., at a voltage equal to or below ground) shunt resistor.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, bipolar transistors could be used in some cases instead of field effect transistors. As another example, output transistor 24 could be included within amplifier 9.

What is claimed is:

1. An integrated circuit current sensing amplifier for sensing a voltage drop across a shunt resistor, comprising:
   (a) a first amplifier having first and second inputs and an output, the second input being connected to a first terminal of the shunt resistor;
   (b) an output transistor having a control electrode coupled to the output of the first amplifier, a first electrode coupled to the first input of the first amplifier, and a second electrode coupled to a first terminal of an output resistor;
   (c) a gain resistor coupled between the first input of the first amplifier and a second terminal of the shunt resistor; and
   (d) wherein the gain resistor has a temperature coefficient which is essentially equal to a temperature coefficient of the shunt resistor.

2. The integrated circuit current sensing amplifier of claim 1 including a voltage regulator coupled between the second terminal of the shunt resistor and a low-side supply voltage terminal of the first amplifier for establishing a voltage on the low-side supply voltage terminal.

3. The integrated circuit current sensing amplifier of claim 1 wherein the shunt resistor is a section of a printed circuit board trace conductor and the gain resistor is composed of essentially the same kind of material as the shunt resistor.

4. The integrated circuit current sensing amplifier of claim 3 wherein the shunt resistor is composed of copper.

5. The integrated circuit current sensing amplifier of claim 4 wherein the gain resistor is a thin film resistor.

6. The integrated circuit current sensing amplifier of claim 1 wherein the output resistor is located outside of the current sensing amplifier.

7. The integrated circuit current sensing amplifier of claim 1 wherein a resistance of the gain resistor is much greater than a resistance of the shunt resistor.

8. The integrated circuit current sensing amplifier of claim 2 wherein the voltage regulator circuitry receives an input voltage in the range from 1.8 to 200 volts and produces an output voltage in the range from 0.9 to 20 volts.

9. The integrated circuit current sensing amplifier of claim 2 including a charge pump producing an output voltage on a second terminal of the output resistor and one a first input of a second amplifier having a second input connected to the second electrode of the output transistor, the second amplifier producing an output voltage of the integrated circuit current sensing amplifier on an output conductor of the integrated circuit current sensing amplifier.

10. The integrated circuit current sensing amplifier of claim 2 wherein the output transistor is a P-channel field effect transistor, the control electrode is a gate, the first electrode is a source, and the second electrode is a drain.

11. The integrated circuit current sensing amplifier of claim 9 wherein the output transistor is a P-channel field effect transistor, the control electrode is a gate, the first electrode is a source, and the second electrode is a drain, the output of the voltage regulator being coupled to a low-side supply voltage terminal of the first amplifier and to an output of a current mirror receiving a bias current as an input.

12. The integrated circuit current sensing amplifier of claim 11 wherein the output resistor is composed of sichrome.

13. The integrated circuit current sensing amplifier of claim 11 including a first resistor coupled between the first input of the second amplifier and the output conductor of the integrated circuit current sensing amplifier, a second resistor coupled between the first input of the second amplifier and the output voltage of the charge pump, a third resistor coupled between the second input of the second amplifier and the output of the first amplifier, and a fourth resistor coupled between the second input of the second amplifier and a ground voltage of the integrated circuit current sensing amplifier.

14. A method for sensing a voltage drop produced across a shunt resistor by a load current flowing through the shunt resistor, the method comprising:
   (a) providing a gain resistor in an integrated circuit current sensing amplifier, the gain resistor having a temperature coefficient essentially equal to a temperature coefficient of the shunt resistor;
   (b) coupling a first terminal of the shunt resistor to a first terminal of the gain resistor and coupling a second terminal of the gain resistor to a first input of an amplifier and coupling a second terminal of the shunt resistor to a second input of the amplifier; and
   (c) coupling an output of the first amplifier to a control electrode of an output transistor, coupling a first electrode of the output transistor to the first input of the amplifier, and coupling a second electrode of the output transistor to a first terminal of an output resistor to produce an output voltage representative of the load current.

15. The method of claim 14 including coupling a voltage regulator between the first terminal of the shunt resistor and a low-side supply voltage terminal of the amplifier.

16. The method of claim 15 including reducing the physical size of the shunt resistor by providing a value of resistance of the gain resistor that is much greater than a value of resistance of the shunt resistor.

17. The method of claim 15 including providing a value of voltage of the first terminal of the shunt resistor that is substantially greater than a ground voltage of an integrated circuit current sensing amplifier which includes the gain resistor, the amplifier, and the output transistor.

18. The method of claim 15 including providing a value of voltage of the first terminal of the shunt resistor that is equal to or less than a ground voltage of an integrated circuit current sensing amplifier which includes the gain resistor, the amplifier, and the output transistor by coupling a first input of an output amplifier to an output of a charge pump which produces an output voltage lower than the ground voltage, coupling a second input of the output amplifier to the second electrode of the output transistor, and coupling a second terminal of the output resistor to the output of the charge pump.

19. The method of claim 14 including forming the shunt resistor as a section of copper conductor on a printed circuit board, and forming the gain resistor as a thin film copper resistor in an integrated circuit current sensing amplifier which includes the gain resistor, the amplifier, and the output transistor.

20. An integrated circuit current sensing amplifier for sensing a voltage drop produced across a shunt resistor by a load current flowing through the shunt resistor, comprising:
   (a) gain resistor means in the integrated circuit current sensing amplifier, the gain resistor means having a temperature coefficient essentially equal to a temperature coefficient of the shunt resistor;
   (b) means for coupling a first terminal of the shunt resistor to a first terminal of the gain resistor and means for coupling a second terminal of the gain resistor to a first input of an amplifier and means for coupling a second terminal of the shunt resistor to a second input of the amplifier; and
   (c) means for coupling an output of the amplifier to a control electrode of an output transistor, means for coupling a first electrode of the output transistor to the first input of the amplifier, and means for coupling a second electrode of the output transistor to an output resistor to produce an output voltage representative of the load current.

* * * * *